(12) United States Patent
Tarutani et al.

(10) Patent No.: US 6,179,920 B1
(45) Date of Patent: Jan. 30, 2001

(54) CVD APPARATUS FOR FORMING THIN FILM HAVING HIGH DIELECTRIC CONSTANT

(75) Inventors: Masayoshi Tarutani; Tsuyoshi Horikawa; Takaaki Kawahara; Mikio Yamamuka, all of Hyogo (JP)

(73) Assignee: Mitsubishi Denki Kabushiki Kaisha, Tokyo (JP)

( * ) Notice: Under 35 U.S.C. 154(b), the term of this patent shall be extended for 0 days.

(21) Appl. No.: 09/150,212

(22) Filed: Sep. 9, 1998

(30) Foreign Application Priority Data

Apr. 7, 1998 (JP) .................................................. 10-094587

(51) Int. Cl.[7] .................................................. C23C 16/00
(52) U.S. Cl. .................................................. 118/715
(58) Field of Search .............................................. 118/715

(56) References Cited

U.S. PATENT DOCUMENTS

| | | | |
|---|---|---|---|
| 4,649,859 | * | 3/1987 | Wanlass ................................. 118/715 |
| 4,817,558 | * | 4/1989 | Itoh ....................................... 118/725 |
| 4,825,809 | * | 5/1989 | Mieno .................................... 118/715 |
| 4,981,722 | * | 1/1991 | Möller et al. .......................... 118/715 |
| 4,986,216 | * | 1/1991 | Ohmori et al. ........................ 118/715 |
| 5,204,314 | | 4/1993 | Kirlin et al. . |
| 5,284,519 | * | 2/1994 | Gadgil .................................. 118/719 |
| 5,338,363 | * | 8/1994 | Kawata et al. ........................ 118/715 |
| 5,372,850 | | 12/1994 | Uchikawa et al. . |
| 5,445,699 | * | 8/1995 | Kamikawa et al. ................... 118/715 |
| 5,458,918 | * | 10/1995 | Hawkins et al. ...................... 118/715 |

FOREIGN PATENT DOCUMENTS

| | | | |
|---|---|---|---|
| WO 90/10092 | * | 9/1990 | (JP) ................................. C23C/16/00 |
| 7-268634 | | 10/1995 | (JP) . |
| 8-176826 | | 7/1996 | (JP) . |
| 8-186103 | | 7/1996 | (JP) . |

OTHER PUBLICATIONS

"Surface Morphologies and Electrical Properties of (Ba, Sr)TiO3 Films Prepared by Two–Step Deposition of Liquid Source Chemical Vapor Deposition", T. Kawahara et al., Jpn. J. Appl. Phys. vol. 34 (1995) pp. 5077–5082.

* cited by examiner

Primary Examiner—Gregory Mills
Assistant Examiner—Sylvia R MacArthur
(74) Attorney, Agent, or Firm—McDermott, Will & Emery

(57) ABSTRACT

A CVD apparatus for forming a thin film having a high dielectric constant, which is improved to suppress source precipitation and residue generation and to achieve stable formation of a BST thin film, is provided. The apparatus includes a reaction chamber, a source gas supply tube, and a reactive gas supply tube. A jet element for jetting out the gas along the inner walls of the reaction chamber is provided to at least one of the source gas supply tube and the reactive gas supply tube.

5 Claims, 3 Drawing Sheets

CVD APPARATUS FOR FORMING THIN FILM HAVING HIGH DIELECTRIC CONSTANT

BACKGROUND OF THE INVENTION

1. Field of the Invention

The present invention generally relates to a CVD apparatus for forming a thin film having a high dielectric constant, and more specifically to a CVD apparatus for forming a variety of thin films, in particular a thin dielectric film such as is used in a semiconductor memory, by Chemical Vapor Deposition (CVD) method. The present invention also relates to a method of forming such dielectric thin film using the CVD method.

2. Description of the Background Art

In recent years, there has been a rapid advancement in the integration of semiconductor memory and devices. For instance, device capacity (number of bits) in a dynamic random access memory (DRAM) has quadrupled in three years. This integration aims at achieving the reduction in size of a device, lower power consumption, and lower cost, and so on. Regardless of the improvement in integration, however, a capacitor, being a DRAM component, must be able to accumulate a certain amount of electric charges. Thus, along with the increase in integration of a device, attempts have been made to minimize the thickness of a capacitor dielectric film or to increase the area of a capacitor by making its shape complex.

Nevertheless, it has become difficult to reduce the film thickness of a conventional capacitor with $SiO_2$ as its main dielectric material. Instead, as a noted alternative measure for increasing storage charge density, the dielectric film material of a capacitor may be replaced with film material having a higher dielectric constant. By using high dielectric constant material, an increase in storage charge density is achieved which is comparable to that obtained by the conventional method of reducing film thickness. Moreover, if a thin film with a high dielectric constant can be used, the film can be of a certain thickness, and the use of a high dielectric constant material may provide advantages with regard to film deposition processes and film reliability.

Most importantly, it is required that such a capacitor dielectric film be a thin film with a high dielectric constant as described above and have small leakage current. The desirable target values for these characteristics, in general, are considered to be approximately 0.5 nm or below for film thickness in $SiO_2$ equivalent and $2 \times 10^{-7}$ A/cm$^2$ or below for leakage current density at the voltage application of 1V.

As such, oxide type dielectric films including tantalum oxide, lead zirconate titanate (PZT), lead lanthanum zirconate titanate (PLZT), strontium titanate (ST), barium titanate (BT), and barium strontium titanate (Ba, Sr) $TiO_3$ (hereafter referred to as BST) seem promising. Moreover, several methods have been devised for producing these thin films, and are being put to practical use experimentally.

Generally, to form a thin film on an electrode for a capacitor of a DRAM having minute steps, film deposition employing a CVD method which provides good coverage to surfaces having complex shape is most advantageous in simplifying the process. In a CVD method, organometallic compound containing a given metal is used as the thin film source having a high dielectric constant. By vaporizing the source and spraying the resulting gas onto a substrate, a thin film with a high dielectric constant is formed. It has been a big problem, however, that a CVD source with a stable and good vaporization characteristic does not exist. This is largely due to the unsatisfactory vaporization characteristic, by heating, of the compound of metal and β-diketon-type dipivaloylmethane (hereinafter referred to as DPM) frequently used as a CVD source.

It was under such circumstances that the applicants proposed in the Japanese Patent Laying-Open No. 7-268634 a CVD source being produced by dissolving a conventional solid material in organic solvent called tetrahydrofuran (THF) and thus having a greatly enhanced vaporization characteristic. Further, a CVD apparatus using liquid source was developed which vaporizes the liquid source and supplies it stably to a reaction chamber. They have also found that this apparatus can be utilized for depositing a high dielectric constant thin film having good surface morphology and electrical characteristics.

Even the use of this CVD apparatus using liquid source, however, has been discovered as not being capable of providing a dielectric film with good stable characteristics that last a long time. Upon examination, it has become apparent that this problem is caused by the very small amount of vaporization residue produced in the vaporization process.

Also, it has been discovered that the vaporizer for making a liquid source proposed by ATM Co. Ltd. in the United States (U.S. Pat. No. 5,204,314) does not provide sufficiently stable film deposition due to the formation of a solid in the portions where the source vaporizes and the consequent blocking of the tubes.

The arrangement of the conventional CVD apparatus using liquid source will be described below.

FIG. 5 is a schematic diagram depicting the representation of a conventional CVD apparatus using liquid source. Here, an example is given in which the BST film is deposited using reactive gas $O_2$ and the liquid source having solid Ba $(DPM)_2$, Sr $(DPM)_2$, and TiO $(DPM)_2$ dissolved in THF. The CVD apparatus includes a source gas supply tube 1, a reactive gas supply tube 2, and a reactor 3. A heating stage 4 is provided in the reactor 3. A susceptor 5 is provided on the heating stage 4. The susceptor 5 supports a substrate 6. A diffusion board 7 is provided in the upper portion of the reactor 3. Pressure gauges 8a, 8b are provided in the reactor 3. An exhaust passage 11 is connected to the reactor 3. A vacuum valve 9 and a pressure controller 10 are provided somewhere along the exhaust passage 11. The CVD apparatus also includes a vaporizer 21, a vaporizer heater 22, a constant temperature box 23, a tube heater 24, and a mixer 25.

The $N_2$ gas 13a having its amount controlled by a gas flow rate controller 16 flows through a connection tube 26 into the vaporizer 21. Ba $(DPM)_2$/THF in a liquid source vessel 17 is pressurized by the $N_2$ gas 13a through a pressure tube 14, has its amount controlled by a liquid flow rate controller 15, and is sent into the vaporizer 21 through the connection tube 26. Sr $(DPM)_2$/THF in a liquid source vessel 18 is pressurized by the $N_2$ gas 13a through a pressure tube 14, has its amount controlled by a liquid flow rate controller 15, and is sent into the vaporizer 21 through the connection tube 26.

TiO $(DPM)_2$/THF in a liquid source vessel 19 is pressurized by the $N_2$ gas 13a through a pressure tube 14, has its amount controlled by a liquid flow rate controller 15, and is sent into the vaporizer 21 through the connection tube 26.

THF in a liquid source vessel 20 is pressurized by the $N_2$ gas 13a through a pressure tube 14, has its amount controlled by a liquid flow rate controller 15, and is sent into the vaporizer 21 through the connection tube 26.

Next, the operation will be described.

The $N_2$ gas 13 having its flow rate regulated by the gas flow rate controller 16 flows through the connection tube 26. The solution sources in liquid source vessels 17, 18, 19, 20 pressurized by the $N_2$ gas 13a through pressure tubes 14 are provided into the connection tube 26, and having their amount controlled by the liquid flow rate controllers 15, are supplied to the vaporizer 21. Thereafter, the supplied liquid sources run into a large area of the inner wall of the vaporizer 21 heated by the vaporizer heater 22 and instantly vaporize. The vaporized sources inside the vaporizer 21 pass through the source gas supply tube 1 heated by the constant temperature box 23 and the tube heater 24 and are supplied into the reaction chamber 3a. The reactive gas 2b, on the other hand, passes through the reactive gas supply tube 2 heated by the constant temperature box 23 and the tube heater 24 and is supplied into the reaction chamber 3a. The source gas and the reactive gas are introduced into the reaction chamber 3a only after they are mixed by the mixer 25. Finally, the source gas and the reactive gas react on the substrate 6 such as a silicon substrate heated by the heating stage 4 to form a BST film. Moreover, the mixed gas which failed to contribute to the formation of a thin film is exhausted by a vacuum pump through the exhaust passage 11.

The pressure in the reaction chamber 3a is controlled to be between 1 and 10 Torr by the pressure controller 10. Since lower temperature provides better step coverage, the temperature of the heating stage 4 is set to 400 to 600° C. By controlling the source flow rate and the duration of film deposition, a film is deposited at the rate of about 30 Å/min, with the film thickness of 300 Å and the BST film composition ratio of (Ba+Sr)/Ti=1.0. An upper electrode is formed by sputtering Pt or Ru on the BST film formed on a lower electrode made of materials such as Pt, Ru, or the like. This sample is used to measure the electrical characteristics of the BST film, such as leakage current and oxide film equivalent film thickness.

The following problems have been recognized when depositing film with the conventional CVD apparatus using liquid source using the above-mentioned CVD source.

First, when introducing the CVD source gas vaporized in the vaporizer and a reactive gas such as $O_2$ gas which is an oxidizing agent into the reaction chamber, both gases cool down as soon as they enter the reaction chamber. Thus, the organometallic compound dissolved in organic solvent precipitates before reaching the substrate. This either remains as residue in tubes and on inner walls of the reaction chamber, or scatters as fine particles, which mix into the device and cause a defect in the device.

Second, when introducing the CVD source gas vaporized in the vaporizer and a reactive gas such as $O_2$ gas which is an oxidizing agent into the reaction chamber, the two are conventionally mixed by a mixer. One of the gases, however, possibly flows backward into a supply tube of the other gas, and the reaction occurs somewhere along the respective gas supply tubes. As a result, the organometallic compound reacts inside the gas supply tubes and the vaporizer which are upstream of the mixer, precipitate forms, and fine particles of the vaporization residue or the reaction product in gaseous phase are produced.

Third, due to the formation of residue as a result of the reaction of the organometallic compound somewhere along the respective gas supply tubes, the conductance of the supply tubes declines, while the internal pressure of the vaporizer increases. Consequently, problems arise where residue forms at an increasing speed, blocking the supply tube, thereby requiring frequent cleaning of the supply tubes.

As described above, inside the conventional CVD apparatus for vaporizing solution, a foreign substance such as the residue of a CVD source would adhere to the vaporizer, the source gas supply tube, the mixer, and so on, causing the pressure of the vaporizer to rise and thus causing more deposition of the residue. In addition, the fine particles which are generated at the same time are taken in by the film being deposited, and become a cause of defect in the device.

SUMMARY OF THE INVENTION

The object of the present invention, therefore, is to solve the problems described above.

Thus, an object of the present invention is to provide a improved CVD apparatus for forming a thin film having a high dielectric constant which inhibits the precipitation of source and the generation of residue.

Another object of the present invention is to provide a CVD apparatus for forming a thin film having a high dielectric constant which is improved so that the thickness of the thin film becomes uniform.

A further object of the present invention is to provide an improved CVD apparatus for forming a thin film having a high dielectric constant which allows stable deposition of the BST thin film.

A still further object of the present invention is to provide an improved CVD apparatus for forming a thin film having a high dielectric constant which increases the yield of production of the devices with good electrical characteristics.

A still further object of the present invention is to provide an improved method for forming a thin film with a high dielectric constant, which inhibits the precipitation of source and the generation of residue as well as provides a thin film of uniform thickness.

In accordance with one aspect of the invention, a CVD apparatus for forming a thin film having a high dielectric constant forms a thin film by reacting a source gas with a reactive gas. The CVD apparatus includes a reaction chamber, a source gas supply tube for supplying the source gas into the reaction chamber, and a reactive gas supply tube for supplying the reactive gas into the reaction chamber. A jet element for jetting out a gas along the inner walls of the reaction chamber is provided to at least one of the source gas supply tube and the reactive gas supply tube.

In accordance with the present invention, a portion of the gas is allowed to contact the inner walls of the reaction chamber for a longer period of time. In general, the inner walls of the reaction chamber are maintained at a high temperature. Since the gas introduced into the chamber receives heat from the inner walls, the drop in temperature is prevented. Thus, the precipitation of source and the generation of residue caused by the drop in temperature are also prevented.

In accordance with another aspect of the invention, the jet element includes a diffusion member having a plurality of holes which jet out the gas in multiple directions along the inner walls of the reaction chamber, and the total opening area of the plurality of holes is made smaller than the sectional area of the supply tubes.

In accordance with the present invention, a portion of the gas remains in contact with the inner walls of the reaction chamber for a longer period of time. As a result, the gas receives heat from the inner walls of the reaction chamber which is kept at a higher temperature. The drop in temperature of the gas is thus prevented and the gas is diffused uniformly inside the entire reaction chamber. Consequently, the precipitation of source and the generation of residue caused by a drop in temperature are prevented, and the uniform adhesion characteristic of the thin film on the surface is maintained. Moreover, since the total opening area of the plurality of holes is made smaller than the sectional area of the gas supply tubes, one of the gases, once having entered into the reaction chamber, does not flow back upstream easily from the gas inlet of the other gas. Thus, the precipitation of source and the generation of residue caused by the reaction of the source gas with the reactive gas inside the supply tubes are suppressed.

In the CVD apparatus in accordance with still another aspect of the invention, the diffusion member is provided on both the source gas supply tube and the reactive gas supply tube, and the holes for the reactive gas supply tubes are provided near the holes of the source gas supply tube.

In accordance with the present invention, the source gas and the reactive gas contact the inner walls of the reaction chamber for a longer period of time, and are warmed by the inner walls kept at a high temperature. The drop in gas temperature is thus prevented, and the gases diffuse inside the entire reaction chamber. In addition, around where the holes in the diffusion member at the inlets of the source gas and the reactive gas are adjacent to each other, respective gases join immediately after being introduced into the reaction chamber, and are mixed sufficiently. As a result, the precipitation of source and the generation of residue caused by the decrease in temperature are prevented, and further the uniform adhesive characteristic of the thin film on the surface is achieved.

In the CVD apparatus in accordance with still another aspect of the invention, the diffusion member of the source gas supply tube and the diffusion member of the reactive gas supply tube are provided overlapping each other in the central portion of the upper wall of the reaction chamber, and the plurality of holes are arranged radially.

In accordance with the present invention, the source gas and the reactive gas contact the inner walls of the reaction chamber for a longer period of time. With their temperatures kept warm by the inner walls of the reaction chamber maintained at a high temperature, the decrease in temperature is prevented and the gases diffuse evenly inside the entire reaction chamber. Thus, the precipitation of source and the generation of residue caused by the temperature drop are prevented, and the uniformity of adhesion characteristic of the thin film on the surface is improved. Further, the gases emitted from the upper central portion of the reaction chamber flow smoothly into the reaction chamber with the convection current occurring inside the chamber. Consequently, there are fewer occurrences of turbulent flow or stagnation, and the precipitation of source and the generation of residue are suppressed, which proves particularly effective in improving the uniformity of adhesion characteristic of the thin film on the surface.

In the method of forming a thin film with a high dielectric constant in accordance with still another aspect of the invention, first, the source gas is obtained by vaporizing in the vaporizer the liquid source prepared by dissolving the DPM-type organometallic compound including Ba, Sr, and Ti into an organic solvent. The source gas is introduced into the reaction chamber through the source gas supply tube. The source gas reacts with the $O_2$ gas inside the reaction chamber to deposit a thin film on a substrate. The partial pressure of the source gas inside the vaporizer, the reaction chamber, and the source gas supply tube is made to be one-hundredth or below of the saturated vapor pressure of the source gas at a given temperature.

In accordance with the present invention, because the partial pressures of all organometallic compounds in their gaseous phase used are made to be one-hundredth or below of the saturated vapor pressure of the source gas at a given temperature, the precipitation of source and the generation of residue inside the source gas supply tube and the reaction chamber are inhibited. In addition, the stable deposition of the BST thin film and the improved yield of production of the devices with good electrical characteristics are achieved.

In the method of forming a thin film having a high dielectric constant in accordance with another aspect of the invention, the organic solvent includes THF or tetraglyme.

In accordance with the present invention, since an organic solvent which includes THF or tetraglyme as its main component is used, the precipitation of source and generation of a residue are suppressed in the source gas supply tube and inside the reaction chamber, and further, the stable deposition of the BST thin film and the improved yield of production of the devices with good electrical characteristics are achieved.

In accordance with still another aspect of the invention, the vaporization is performed at a temperature between 230° C. and 280° C., and the vaporization and the film deposition at the pressure of 10 Torr or below.

In accordance with the present invention, since the vaporization is performed at a temperature between 230° C. an 280° C., and the pressure for the vaporization and the film deposition is 10 Torr or below, the precipitation of source and the generation of residue are suppressed inside the source gas supply tube and the reaction chamber, and further, the film deposition stability of the BST thin film and the yield of production of the devices with good electrical characteristics are improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will be described below based on the drawings. In these embodiments, solid Ba $(DPM)_2$, Sr $(DPM)_2$, and TiO $(DPM)_2$ are used as the organometallic compound source. Moreover, to dissolve these, THF is used as the organic solvent. As a liquid source, THF solution of the solid material is used, and by using the oxidizing agent $O_2$ gas as a reactive gas, the BST thin film is deposited.

First Embodiment

Figure 1:
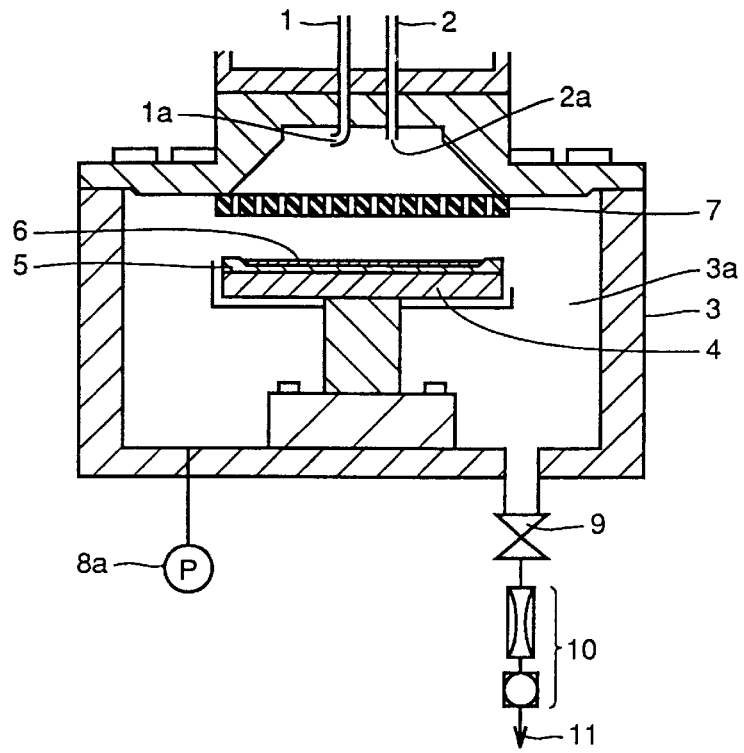
FIGS. 1 to 4 are schematic diagrams of the CVD apparatus for forming a thin film with a high dielectric constant according to the first to the fourth embodiments, respectively.

FIG. 1 is a schematic diagram representing a part of the CVD apparatus using liquid source, according to the first embodiment. Same reference numerals denote the same or corresponding portions of the conventional apparatus shown in FIG. 5, and the description thereof is not repeated.

The vaporized source passes through the source gas supply tube 1 while the $O_2$ gas passes through the reactive gas supply tube 2, and the gases are respectively supplied into the reaction chamber 3a. The source gas and the $O_2$ gas are mixed in the space above a diffusion board 7, are jet out from the plurality of holes in the diffusion board 7, cause reaction on the heated substrate 6, and form a BST film.

Figure 5:
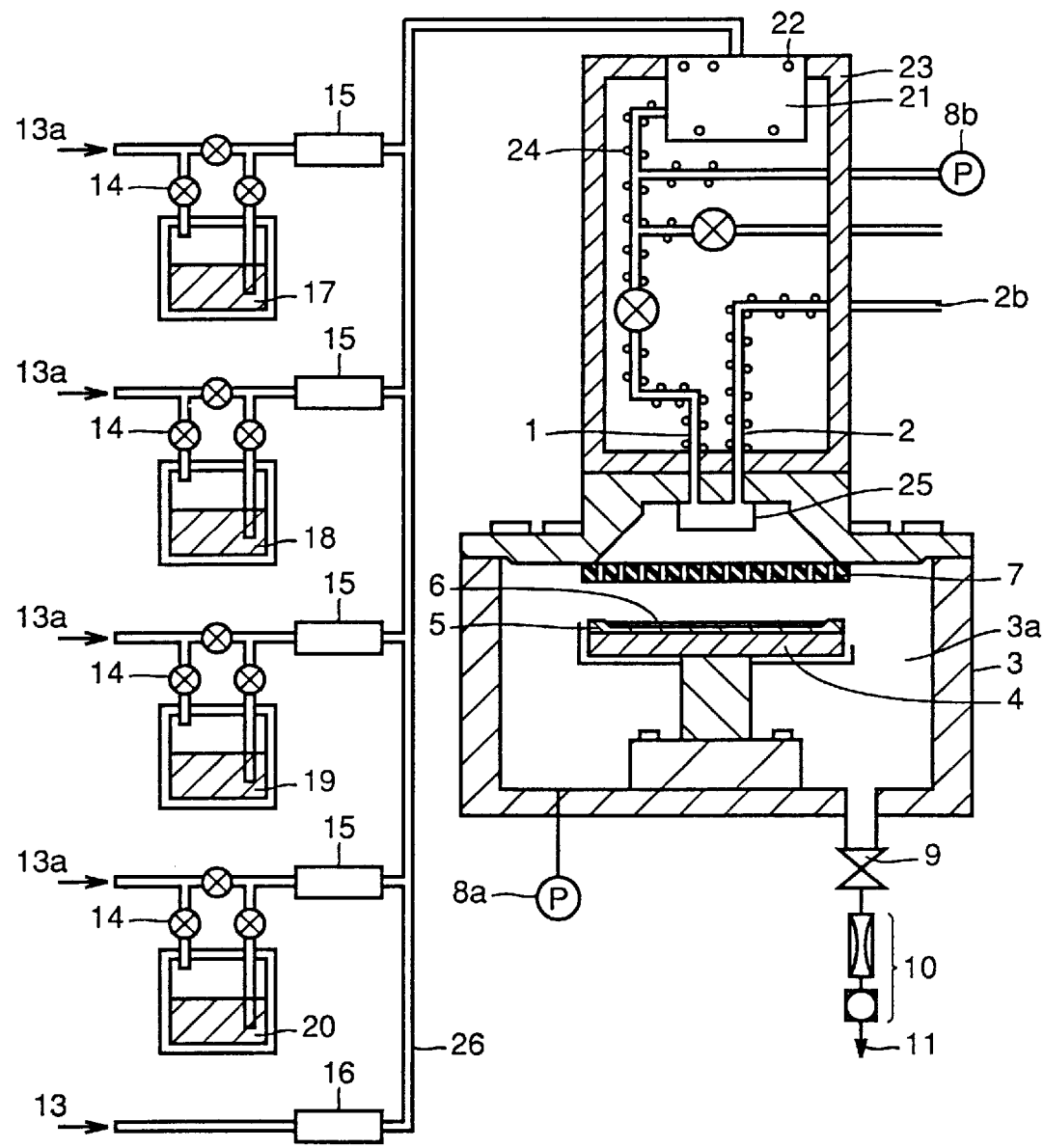
FIG. 5 is a schematic diagram of the conventional CVD apparatus for forming a thin film with a high dielectric constant.

With the conventional CVD apparatus shown in FIG. 5, when dispersing the source gas and the reactive gas by a mixer 25, a portion of either gas flows back into the supply tube of the other gas, causing residue to generate inside the mixer portion and the gas supply tubes, which leads to the problem of the film deposition characteristic being varied. Another problem is the degradation of the BST film characteristic due to the fine particles that are formed. Further, even with the mixer removed, the source gas and the $O_2$ gas, upon directly entering the reaction chamber having a substantially larger space than the supply tubes, expand and thus undergo a drop in temperature, which causes a portion of the source to come out of its gas phase to precipitate, and fine particles to form.

On the other hand, the CVD apparatus shown in FIG. 1 has at least one of the source gas inlet 1a and the reactive gas inlet 2a structured such that the gas jets out along the inner walls of the reaction chamber 3a. The gas, therefore, receives heat from the reactor 3 wall surface warmed up to a high temperature, preventing the decrease in gas temperature.

Moreover, although the source gas inlet 1a and the reactive gas inlet 2a are provided in the upper portion of the reactor 3 in the first embodiment, the present invention is not restricted to this arrangement. The source gas inlet 1a and the reactive gas inlet 2a may be provided on the sidewalls of the reactor. In addition, a plurality of source gas inlets 1a and a plurality of reactive gas inlets 2a may be provided.

The use of the CVD apparatus in accordance with the first embodiment decreases the generation of foreign substance of sizes from few microns to several tens of microns. As a result, for capacitors employing a BST film, the number of capacitors with faults such as those pertaining to electrical characteristics is decreased.

Second Embodiment

Figure 2:
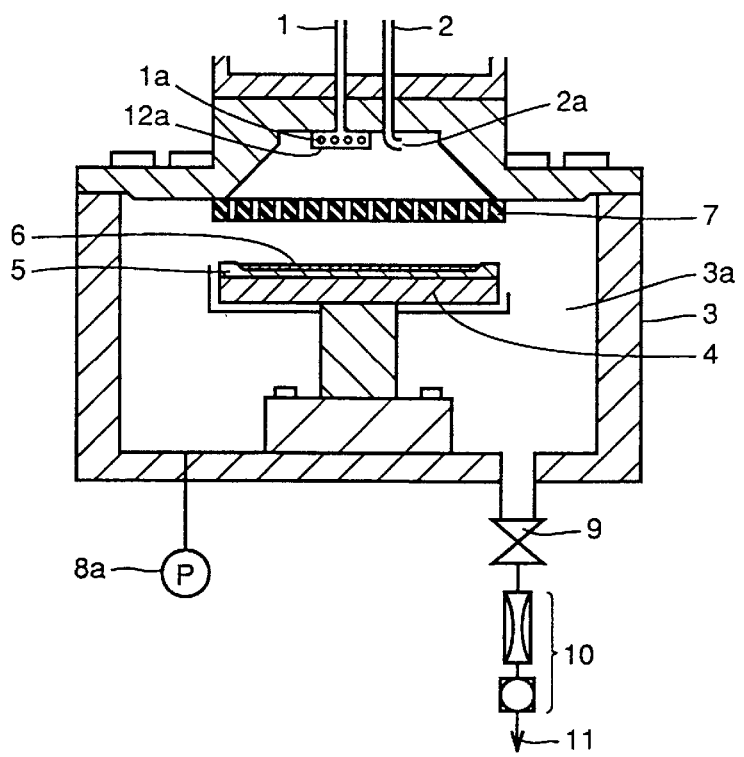

FIG. 2 is a schematic diagram showing a portion of the CVD apparatus using liquid source according to the second embodiment. In the CVD apparatus according to the second embodiment, at least one of the source gas inlet 1a and the reactive gas inlet 2a has a diffusion device 12a which allows the gas to jet out in multiple directions along the inner walls of the reaction chamber 3a. Here, the diffusion device 12a is connected to the source gas inlet 1a. A source gas is jet out in multiple directions along the inner walls of the reactor 3. The source gas then receives heat from the inner walls which are heated to a high temperature, and diffuses evenly inside the entire reaction chamber 3a. Accordingly, the generation of residue is suppressed and film deposition with excellent uniformity on the surface is achieved.

The total opening area of holes provided in the diffusion device 12a is sufficiently smaller than the sectional area of the supply tube 1 through which the source gas is supplied. The capacity of the reaction chamber 3a is sufficiently large. The pressure inside the reaction chamber 3a is regulated to an appropriate pressure by a pressure controller 10. In this configuration, the flowing back of the source gas and the reactive gas into the other side respectively can be prevented.

In the second embodiment, the source gas inlet 1a and the reactive gas inlet 2a are illustrated as being provided in the upper portion of the reactor 3. The present invention, however, is not limited to this example, and the source gas inlet 1a and the reactive gas inlet 2a may be provided on a sidewall of the reactor 3. Moreover, a plurality of inlets may be provided on the reactor 3.

The use of the CVD apparatus according to FIG. 2 improves the uniformity on the surface of the deposited BST film. Further, the generation of residue inside the reaction chamber 3a and the tube passages is decreased significantly, and as a result, the cleaning of the device becomes less frequent and the productivity is greatly improved.

Third Embodiment

Figure 3:
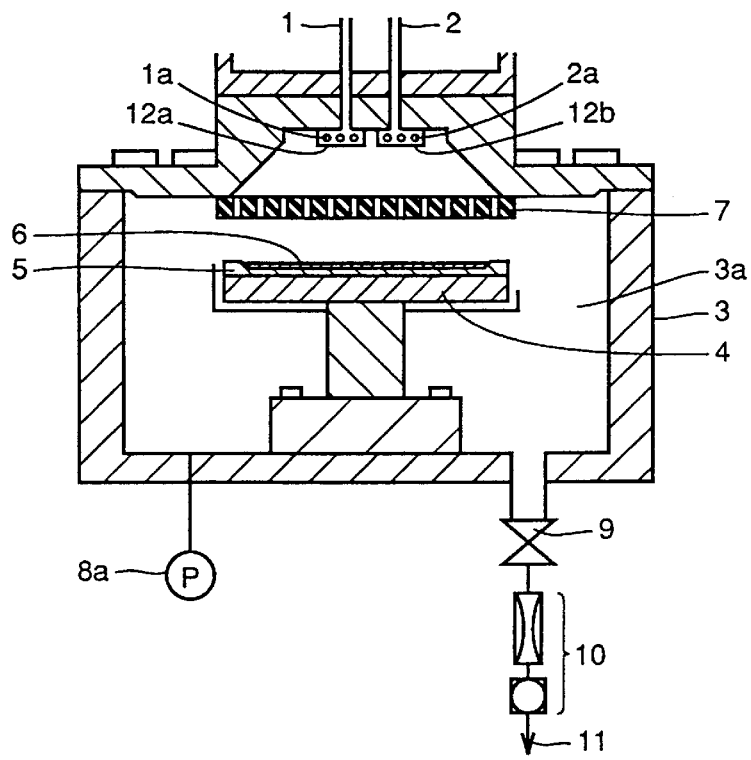

FIG. 3 is a schematic diagram showing a portion of the CVD apparatus using liquid source according to the third embodiment. Referring to FIG. 3, diffusion devices 12a, 12b are provided to both the source gas inlet 1a and the reactive gas inlet 2a, allowing the gases to jet out in multiple directions along the inner walls of the reaction chamber 3a. The source gas and the $O_2$ gas jet out in multiple directions along the inner walls of the reaction chamber 3a. The total opening area of holes provided in diffusion devices 12a, 12b is sufficiently smaller than the sectional area of the supply tube through which the source gas is supplied. The capacity of the reaction chamber 3a is sufficiently large. The pressure inside the reaction chamber 3a is controlled appropriately by the pressure controller 10. In the CVD apparatus according to the third embodiment, as in the second embodiment, one of the gases does not easily flow back into the supply tube of the other gas. Also, a portion of a source gas and a portion of the $O_2$ gas are mixed as soon as they enter the reaction chamber 3a, and the reaction begins. Consequently, the ratio of unreacted source to be exhausted is lowered further. In addition, the rate of film deposition increases.

In this embodiment, the deposited BST film possesses an excellent characteristic of uniformity on the surface. Further, the generation of residue significantly decreases in either of the tube passages of the source gas supply tube and the reactive gas supply tube. Also, the cleaning of the apparatus becomes even less frequent, and the productivity is improved still further.

Fourth Embodiment

Figure 4:
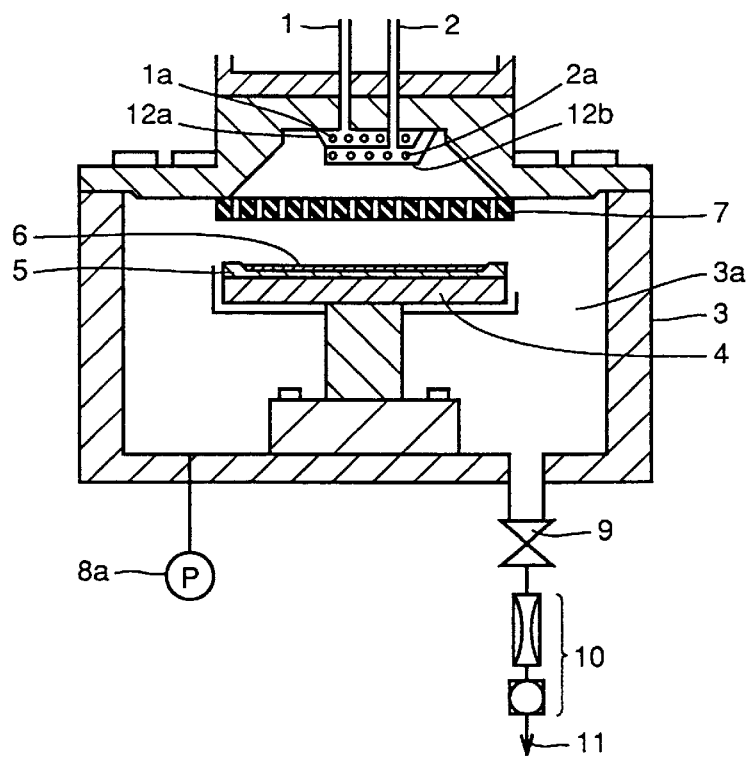

FIG. 4 is a schematic diagram showing a portion of the CVD apparatus using liquid source according to the fourth embodiment. Referring to FIG. 4, the source gas inlet 1a and the reactive gas inlet 2a are connected to diffusion devices 12a, 12b divided respectively into upper and lower layers. Many holes are provided in the diffusion devices 12a, 12b respectively to allow the gases to jet out in multiple directions along the inner walls of the reaction chamber 3a. The source gas and the $O_2$ gas are jet out in multiple directions along the inner walls of the reactor 3. The total opening area of the holes provided in diffusion devices 12a, 12b is sufficiently smaller than the sectional area of the supply tubes through which the gases are supplied. Also, the reaction chamber 3a has a sufficiently large space. Further, the pressure inside the reaction chamber 3a is controlled appropriately by the pressure controller 10. In this configuration, one of the gases does not easily flow back into the supply tube of the other gas. With the apparatus according to the fourth embodiment, a portion of the source gas and a portion of the $O_2$ gas are effectively mixed immediately after they enter the reactor 3.

The holes of the upper layer and lower layer diffusion devices 12a, 12b are aligned vertically and are positioned at even intervals radially in the direction toward the center. In this configuration, the source gas and the $O_2$ gas are mixed evenly. Diffusion devices 12a, 12b are provided in the central portion of the upper wall surface of the reaction chamber 3a. Inside, the reaction chamber 3a is partitioned by a diffusion board 7, and the supplied gases circulate in the space above the diffusion board 7. Since the gases jet out from the upper central portion of the reaction chamber 3a, the gases may be poured into the reaction chamber 3 along the convection current without disturbing the current. This is consistent with the aims of allowing the gases to flow along the inner walls, which are at a high temperature, of the reactor and of preventing the drop in gas temperature.

In this embodiment, among the characteristics of the deposited BST film, the uniformity of composition on the surface is improved, and good electrical characteristics are achieved. Moreover, in either of the tube passages of the source gas supply tube and the reactive gas supply tube, the generation of residue significantly decreases, the cleaning of the device becomes markedly infrequent, and the productivity is greatly improved.

In Table 1, an example is shown of the characteristics of the film deposited using the conventional CVD apparatus using liquid source and the apparatus of the present invention.

TABLE 1

|  | conventional CVD device | device according to the present invention |
|---|---|---|
| pressure of vaporizer (Torr) | 15~25 | 5~10 |
| ratio of residue (%) | 5~20 | 0~2 |
| film deposition rate [Å/min] | ~50 | ~90 |

Using the same source and the same flow rate, the pressure inside the vaporizer of the conventional apparatus is between 15 and 25 Torr whereas that of the apparatus according to the present invention is lowered to 5 to 10 Torr. The ratio of residue, which is the ratio of the amount that failed to vaporize to the total amount of the supplied solid source, has decreased from between 5 and 20% to between 0 and 2%. Further, the film deposition rate has been effectively increased from 30 to 50 Å/min to 50 to 90 Å/min. Thus, in the fourth embodiment, the source flow rate itself which is used to form the BST film having similar characteristic as the conventional BST film is lower, and as a result, the generation of residue decreases. Because of the decrease in pressure inside the vaporizer and the decrease in the amount of source consumed, there is less need of cleaning the apparatus.

Fifth Embodiment

In relation to this embodiment, the characteristics of the BST film deposition process using a CVD apparatus using liquid source, will be described. Table 2 represents the experimental data showing the relationship between the pressure inside the vaporizer and the ratio of residue of source.

TABLE 2

| pressure of vaporizer [Torr] | 5 | 10 | 25 | 50 | 100 |
|---|---|---|---|---|---|
| ratio of residue [%] | 0 | 2 | 23 | 80 | 95 |

Here, the temperature of the vaporizer is 250° C. It is noted that residue tends to increase with the increase in pressure, and particularly when the pressure is at around 25 Torr, residue is observed to increase rapidly.

The generation of residue is caused either when the amount of the existing source gas exceeds beyond its saturated vapor pressure or when the source gas, unable to sustain its gas phase as the saturated vapor pressure decreases due to the change in condition, precipitates. The details concerning saturated vapor pressure are described, for instance, in "Vapor Pressure of Sr $(dpm)_2$" (Extended Abstracts: The 44th Spring Meeting, 1997, The Japan Society of Applied Physics and Related Societies, No. 2, p. 398). According to the article, the saturated vapor pressure of Sr $(DPM)_2$ is estimated to be 0.1 Torr at 231° C., and 0.316 Torr at 250° C. Therefore, it may be necessary to control the total pressure of the reaction chamber, the tubes, and the vaporizer in order to lower the partial pressure of the source below the saturated vapor pressure, or to determine the conditions so as to increase the ratio of the gas components such as the $O_2$ gas or THF so that the partial pressure of the source gas is lowered.

For example, at the temperature of 250° C. and at the pressure of 10 Torr, with Sr $(DPM)_2$ being the only source supplied at 0.0001 mol per minute, the other gas components should amount to 0.00306 mol (per minute).

On the other hand, in the actual experiment, the flow rate of the gas components other than the source, which enabled the inhibition of the residue generation due to the failure in vaporization, is discovered to correspond to 0.306 mol (per minute) under the above-described conditions. Accordingly, it is noted that the amount of the source gas is required to be set at one-hundredth of its saturated vapor pressure so that it is sufficient even for film deposition over a long period of time.

In the conventional apparatus, due to the generation of residue, the vaporization characteristic of the source varies and the stability of film deposition is degraded. Also, there is a problem of the fine particles produced from the residue mixing into the BST film causing adverse effect to its electrical characteristics. According to the fifth embodiment, however, the amount of residue may be sufficiently lowered.

Sixth Embodiment

A further characteristic of the BST film deposition process using the CVD apparatus using liquid source will be described in relation to the sixth embodiment. THF and tetraglyme used here have excellent solvent power as organic solvent for a DPM-type organic metal and are known to improve the vaporization characteristic of the DPM-type organic metal. By applying this to the present invention, the source can be vaporized stably, and stable film deposition without the generation of residue can be achieved.

Seventh Embodiment

With the seventh embodiment, a still further characteristic of the BST film deposition process using the CVD apparatus using liquid source, will be described. Table 3 shows the relationship between the vaporizer temperature and the ratio of residue of source.

TABLE 3

| temperature of vaporizer [° C.] | 200 | 220 | 240 | 260 | 280 | 300 |
|---|---|---|---|---|---|---|
| ratio of residue [%] | 20 | 6 | 2 | 0 | 0 | 5 |

Here, the pressure of the vaporizer is set at 10 Torr. The generation of residue is lowest when the temperature of vaporizer is between 260° C. and 280° C. By applying this knowledge to the present invention, the amount of residue may be lowered.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A CVD apparatus for forming a thin film having a high dielectric constant by reacting a source gas with a reactive gas to form a thin film, the CVD apparatus comprising:

a gas mixing chamber and a reaction chamber connected by a diffusion plate provided therebetween;

a source gas supply tube having a tip portion protruding into said gas mixing chamber for supplying said source gas into said gas mixing chamber;

a reactive gas supply tube having a tip portion protruding into said gas mixing chamber for supplying said reactive gas into said gas mixing chamber;

a first jet means provided at said tip portion of said source gas supply tube, for jetting out said source gas alone; and a second jet means provided at said tip portion of said reactive gas supply tube separately from said first jet means, for jetting out said reactive gas alone; wherein a side wall surface of said gas mixing chamber is formed as having a slope that extends outward toward a direction of said diffusion plate, and said first jet means or said second jet means includes a diffusion member having a plurality of holes which face said slope.

2. The CVD apparatus for forming a thin film having a high dielectric constant according to claim 1, wherein total opening area of said plurality of holes is made smaller than sectional area of said supply tubes.

3. The CVD apparatus for forming a thin film having a high dielectric constant according to claim 2, wherein said diffusion member is provided to both said source gas supply tube and said reactive gas supply tube, and holes of said reactive gas supply tube is provided near holes of said source gas supply tube.

4. The CVD apparatus for forming a thin film having a high dielectric constant according to claim 3, wherein said diffusion member of said source gas supply tube and said diffusion member of said reactive gas supply tube are provided overlapping each other in central portion of an upper wall surface of said gas mixing chamber, said plurality of holes arranged radially in each of the diffusion members.

5. The CVD apparatus of claim 1, wherein both said first jet means and said second jet means include a diffusion member having a plurality of holes which face said slope.

* * * * *